United States Patent
Hamada

(10) Patent No.: US 7,850,358 B2
(45) Date of Patent: Dec. 14, 2010

(54) LIGHT SOURCE DEVICE, BACKLIGHT UNIT, AND LIQUID CRYSTAL DISPLAY DEVICE

(75) Inventor: Tetsuya Hamada, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 346 days.

(21) Appl. No.: 12/088,113

(22) PCT Filed: May 18, 2006

(86) PCT No.: PCT/JP2006/309942
§ 371 (c)(1), (2), (4) Date: Mar. 26, 2008

(87) PCT Pub. No.: WO2007/037036
PCT Pub. Date: Apr. 5, 2007

(65) Prior Publication Data
US 2009/0116223 A1    May 7, 2009

(30) Foreign Application Priority Data
Sep. 28, 2005    (JP) .................... 2005-282816

(51) Int. Cl.
*F21V 7/04* (2006.01)

(52) U.S. Cl. .............. 362/612; 362/97.1; 362/225; 362/600; 362/603; 362/800

(58) Field of Classification Search ............ 362/97.1, 362/97.2, 97.3, 800, 600, 603, 611, 612, 362/561, 555
See application file for complete search history.

(56) References Cited

U.S. PATENT DOCUMENTS

2006/0114693 A1* 6/2006 Chou et al. ............. 362/631
2006/0221636 A1* 10/2006 Ohashi et al. ........... 362/612
2006/0221637 A1* 10/2006 Chikugawa et al. ..... 362/612
2007/0103908 A1* 5/2007 Tabito et al. ............. 362/294
2007/0115687 A1* 5/2007 Verweg et al. ........... 362/612
2007/0165421 A1* 7/2007 Sakai et al. .............. 362/612

FOREIGN PATENT DOCUMENTS

| JP | 64-5401 | 1/1989 |
|---|---|---|
| JP | 1-146248 U | 10/1989 |
| JP | 3-22467 U | 3/1991 |
| JP | 7-191311 A | 7/1995 |
| JP | 2001-155910 A | 6/2001 |
| JP | 2001-250404 A | 9/2001 |
| JP | 2004-029370 A | 1/2004 |
| JP | 2004-279921 A | 10/2004 |
| JP | 2004-340830 A | 12/2004 |
| JP | 2005-243256 A | 9/2005 |

OTHER PUBLICATIONS

Official communication issued in the International Application No. PCT/JP2006/309942, mailed on Jul. 4, 2006.
Tetsuya Hamada; "Backlight Unit and Liquid Crystal Display Device"; U.S. Appl. No. 12/088,103, filed Mar. 26, 2008.

* cited by examiner

*Primary Examiner*—Sandra L O Shea
*Assistant Examiner*—Danielle Allen
(74) *Attorney, Agent, or Firm*—Keating & Bennett, LLP

(57) ABSTRACT

A light source device, a backlight unit, and a liquid crystal display device are each capable of improving uniformity of a luminance and a color of a display surface. The light source device includes a board; a plurality of point light sources arranged on a surface of the board and connected in series; and a variable resistor, wherein the variable resistor is disposed on the surface on which the plurality of point light sources are arranged of the board; at least one point light source arranged on an end side among the plurality of point light sources is connected in parallel to the variable resistor; and the board has a through-hole in a region where a variable resistor is located.

20 Claims, 6 Drawing Sheets

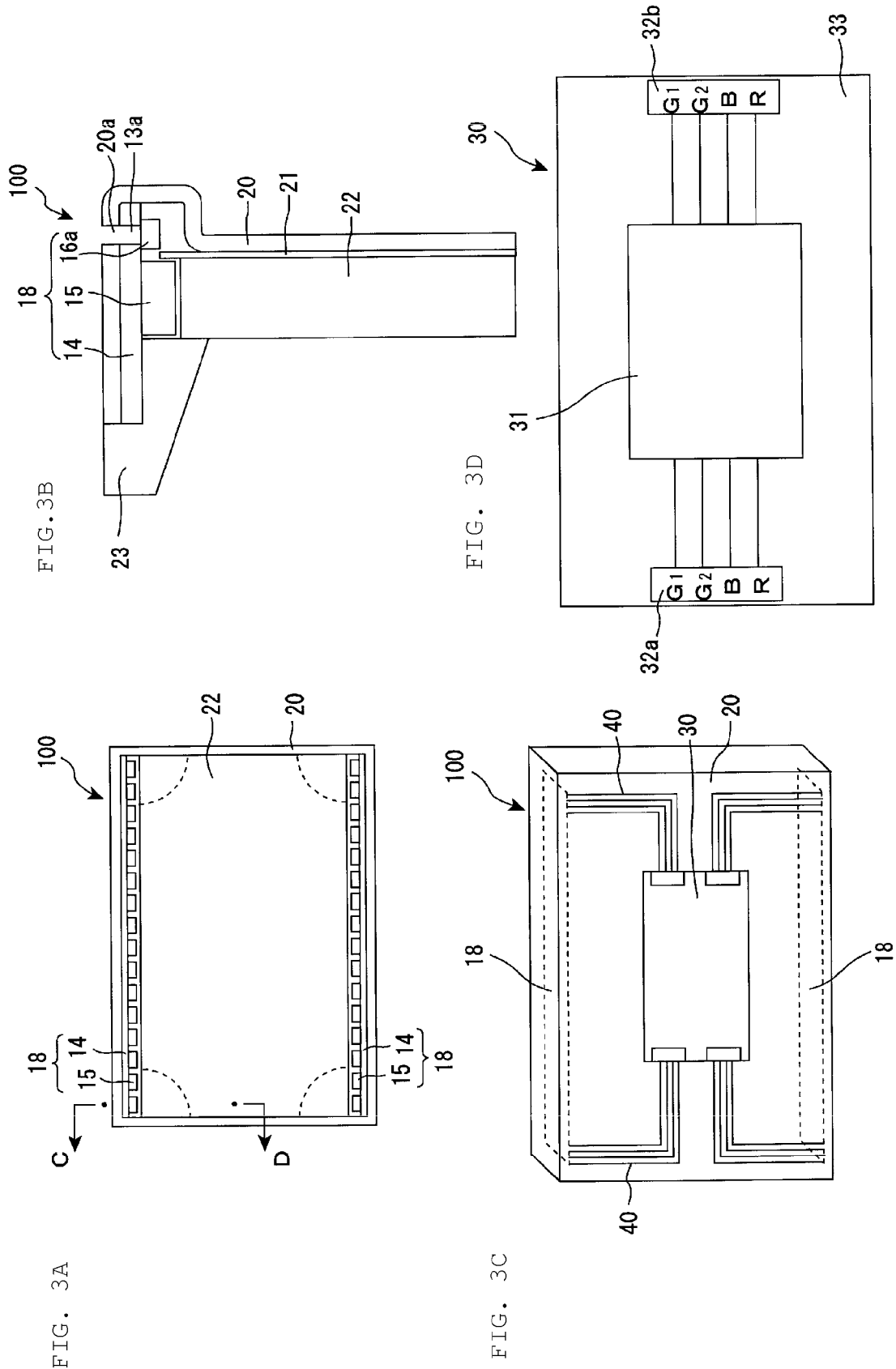

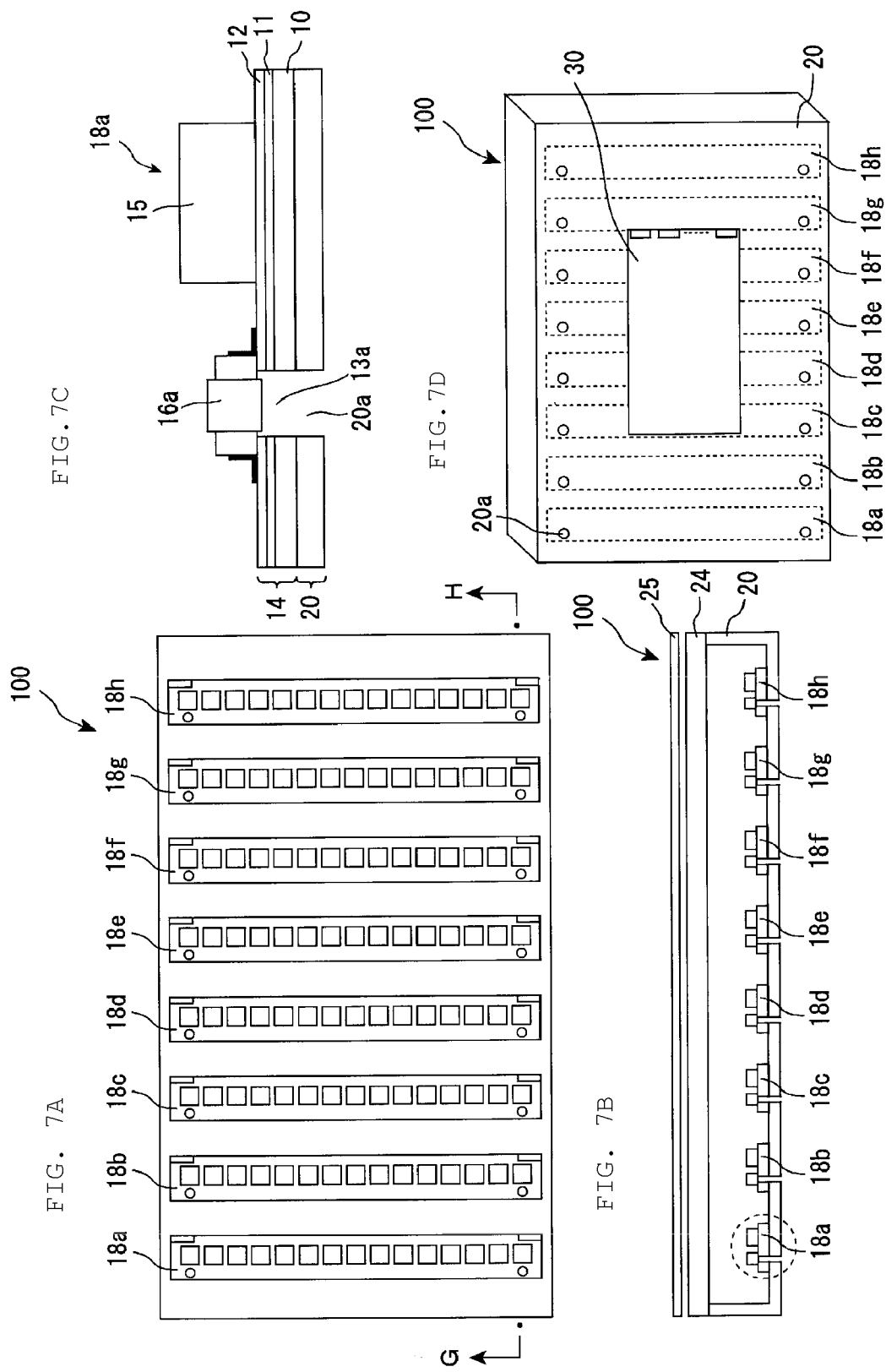

LIGHT SOURCE DEVICE, BACKLIGHT UNIT, AND LIQUID CRYSTAL DISPLAY DEVICE

This Nonprovisional application claims priority (under the Paris Convention and the domestic law in the country to be entered into the national phase) of Japanese Patent Application No. 2005-282816 filed in Japan on Sep. 28, 2005, the entire contents of which are hereby incorporated by reference.

BACKGROUND OF THE INVENTION

1. Field of the Invention

The present invention relates to light source devices, backlight units, and liquid crystal display devices. More specifically, the present invention relates to a light source device that is used as a component of a backlight unit mounted for a display device such as a liquid crystal display device. The present invention also relates to a backlight unit, and a liquid crystal display device.

2. Description of the Related Art

A liquid crystal display device is a non-self-luminous display, and therefore, it generally includes a backlight unit on the back surface of a liquid crystal display panel in order to improve display visibility. This backlight unit includes a light source and its driving circuit as components. Based on the position where the light source is arranged, such backlight units are classified into a direct backlight unit in which the light source is arranged on the lower surface of a liquid crystal display panel and a side backlight unit in which the light source is arranged on a side surface of a liquid crystal display panel. The direct backlight unit has high light use efficiency and a high luminance, and therefore it has been used in in-vehicle applications and the like for which a high luminance is needed but a slim profile is not needed. The side backlight unit has a slim profile and has high luminance uniformity, and therefore, for example, it has been used in laptop computers for which a slim profile is needed or used in display for full color images for which high image qualities are needed.

Among such backlight units, a light-emitting diode backlight unit including a light-emitting diode (hereinafter, also referred to as "LED") as the light source has recently attracted much attention. This is because the LED backlight unit permits a reduction in costs, direct drive by a direct-current power, noise free operation, and the like. Further, an LED backlight unit including LEDs of many colors such as red (R), green (G) and blue (B) can display bright color images with high saturation.

FIG. 8A is a planar view schematically showing a configuration of a conventional side LED backlight unit. FIG. 8B is a cross-sectional view schematically showing the conventional side LED backlight unit taken along line I-J in FIG. 8A.

As shown in FIGS. 8A and 8B, according to a conventional side LED backlight unit 200, a reflective sheet 71 and a light guide plate 72 are stacked on the bottom surface of a back frame 70. Further, in an LED backlight module 68 arranged on the end surface side of the light guide plate 72, an LED 65 is arranged toward the end surface side of the light guide plate 72. Light emitted from the LED 65 is repeatedly reflected inside the light guide plate 72, and then emitted to the display surface side. According to the LED backlight unit 200 having such a configuration, as shown in FIG. 8A, LEDs 65 of a plurality of colors are connected in series for every color. The LEDs 65 are arranged from one end to the other end of the sides of the display surface at regular intervals. As shown in FIG. 8A, corners (regions shown by the dotted line) and other regions of the display surface have different light amounts from the LEDs 65 of the respective colors. Therefore, uneven color is displayed on the display surface.

Japanese Kokai Publication No. 2004-279921 describes a display device in which a substrate is provided with an exposure part such as a through-hole so that variable electronic components are exposed in order to freely adjust the variable electronic components even after combining the substrate provided with the variable electronic components with an electro-optic device. This reference discloses that a variable resistor (variable electronic component) is adjusted and a voltage for driving liquid crystals is varied, and thereby contrast of displayed images is adjusted.

SUMMARY OF THE INVENTION

The present invention has been made in view of the above-mentioned state of the art. Preferred embodiments of the present invention provide a light source device, a backlight unit, and a liquid crystal display device, each capable of improving uniformity of a luminance and a color on a display surface.

The present inventors made various investigations of a light source device including a board on which a plurality of point light sources such as LEDs, connected in series, are formed. The inventors discovered that if a fixed resistor for adjusting a luminance is connected in parallel to the point light source arranged on the end side, an amount of an electric current flowing into the point light source is reduced to decrease an amount of luminescence, and as a result, the corners and other regions of the display surface have substantially the same color tone and the uniformity of the luminance and the color on the display surface can be improved.

However, the results of the study show that even if the above-mentioned measures are taken, uneven color cannot be sufficiently prevented from being displayed at the corners of the display surface because the point light sources such as LEDs have various light-emitting characteristics. Further, the uneven color on the display surface is generally examined after the backlight unit is assembled. According to the configuration of the conventional LED backlight unit 200 shown in FIG. 8B, the LED backlight module (light source device) 68 is fixed to the side surface of the back frame 70. Therefore, once a fixed resistor is attached inside the LED backlight module 68 and the unit 200 is assembled, the fixed resistor cannot be exchanged until the unit 200 is disassembled.

Therefore, the present inventors further made various investigations and discovered that if a variable resistor is formed on the surface where the point light sources are formed on the board, at least one point light source arranged on the end side among the point light sources is connected in parallel to the variable resistor, a resistance value can be adjusted without exchange of the resistor. The inventors further discovered that if a through-hole is formed in a variable resistor-arranged region on the board and a through-hole is also formed in the side surface of the back frame to be connected to the through-hole of the board, a resistance value of the variable resistor can be adjusted through these through-holes from the side opposite to the side where the point light sources are formed, without disassembling the backlight unit even after the unit is assembled. As a result, the inventors discovered that the uniformity of the luminance and the color on the display surface can be improved. The above-mentioned problems can be admirably solved, leading to the development and completion of various preferred embodiments of the present invention.

According to a preferred embodiment of the present invention, a light source device includes: a board; a plurality of point light sources arranged on a surface of the board and connected in series; and a variable resistor, wherein the variable resistor is formed on the surface on which the plurality of point light sources are arranged of the board; at least one point light source arranged on an end side among the plurality of point light sources is connected in parallel to the variable resistor; and the board has a through-hole in a variable resistor-arranged region.

According to the light source device, a plurality of point light sources connected in series are arranged on the board. Examples of the point light sources include light-emitting elements such as a light-emitting diode (LED), and laser light sources such as a semiconductor laser light source. The color of the light emitted from the point light sources is not especially limited. Examples of the color include chromatic colors such as red (R), green (G), blue (B), yellow (Y), cyan (C), magenta (M), and orange, and white (W). The plurality of point light sources include point light sources of one color. However, it is preferable that the number of colors of the point light sources is larger in terms of expansion of the color reproduction range in the display device. The plurality of point light sources preferably include point light sources of two or more colors, and more preferably include point light sources of three or more colors. If the plurality of light sources include point light sources of two or more colors, it is preferable that the point light sources are arranged in such a way that a specific color array pattern (for example, GBGR) is repeated in view of improvement in color uniformity on the display surface. If the color array pattern consists of an odd number of the point light sources, it is preferable that the point light sources are arranged to be symmetric to the center point light source. If the color array pattern consists of an even number of the point light sources, it is preferable that the point light sources are arranged to be symmetric to the center of the array. The plurality of point light sources connected in series mean that at least two of the point light sources are connected in series. It is preferable that all of the plurality of point light sources are connected in series. If the plurality of point light sources include point light sources of two or more colors, it is preferable that the point light sources are generally connected to one another in series every color. However, if the color array repeatable pattern includes the same color, that is, if the point light source array repeatable pattern include the point light sources of the same color, it is preferable that the point light sources of the same color are individually connected in series. For example, if the color array repeatable pattern consists of $G_1BG_2R$ ($G_1$ and $G_2$ are both G), it is preferable that the $G_1$ point light source and the $G_2$ point light source are individually connected in series.

In the present description, the term "on the board" means "on the internal surface of the board (the surface toward the inside of the backlight unit and the like)" or "on the external surface of the board (the surface toward the outside of the backlight unit and the like)". The point light sources are generally arranged on the internal surface of the board. It is preferable that the plurality of point light sources are substantially linearly arranged. The plurality of point light sources are preferably arranged in a zig-zag pattern as long as the operation and effects of the present invention are exhibited. Reflow soldering and the like may preferably be used as a method of mounting the point light sources. The configuration of the board includes a configuration in which a circuit layer is arranged on a support board. In this case, the point light sources are generally arranged on the circuit layer. The material for the support board preferably has reflectivity in terms of improvement in directionality of light emitted from the point light sources. Aluminum and the like may preferably be used as the material for the support board. Metals and the like may preferably be used as a material for the circuit layer. A printing method and the like may preferably be used as a method of forming the circuit layer. If the support board is made of a conductive material such as aluminum, an insulating layer is generally arranged between the support board and the circuit layer.

The light source device includes a variable resistor on the same surface where the point light sources are formed on the board. At least one point light source arranged on the end side among the point light sources is arranged parallel or substantially parallel to the variable resistor. The board has a through-hole in a variable resistor-arranged region. According to this unique configuration, a resistance value of the variable resistor can be adjusted, through the through-hole, from the side opposite to the side where the point light sources are mounted without disassembling the backlight unit even after the unit is assembled. Therefore, the uniformity of the luminance and the color on the display surface can be improved.

The variable resistor is not especially limited as long as the resistance value of the variable resistor can be adjusted through the through-hole. Reflow soldering and the like may preferably be used as a method of mounting the variable resistor. If the board has a configuration in which the circuit layer is arranged on the support board, the variable resistor is generally arranged on the circuit layer, as in the point light sources. In this case, it is preferable that the variable resistor is mounted in the same step of mounting the point light sources.

In the present description, the term "at least one point light source arranged on the end side" includes not only the point light source arranged at the end (the end point light source) but also the point light sources arranged near the end on the board. The number of the point light sources arranged on the end side is not especially limited, and it is appropriately determined in view of the size of the light source device or the operation and effects of the present invention. Examples of the configuration in which at least one point light source arranged on the end side is connected in parallel to the variable resistor include a configuration in which only the point light source at the end is connected in parallel to the variable resistor, a configuration in which the point light source at the end and the point light source that is the second from the end are individually connected in parallel to the variable resistors, and a configuration in which the point light source at the end, the point light source that is the second from the end, and the point light source that is the third from the end are individually connected in parallel to the variable resistors. A configuration in which all of the point light sources are each connected in parallel to the variable resistors also may preferably be used. With respect to the variable resistor, it is preferable that one variable resistor is connected in parallel to one point light source. However, a plurality of variable resistors may be connected in parallel to one point light source. The point light source may be connected in parallel to a fixed resistor, in addition to the variable resistor. Among the point light sources arranged on the end side, a point light source not connected to the variable resistor may be connected in parallel to only a fixed resistor. The end side generally means both end sides, but it may be either one end side.

The shape of the through-hole is not especially limited, and examples thereof include a columnar shape and a prismatic shape. The size of the through-hole is not especially limited as long as the resistance value of the variable resistor can be adjusted. One through-hole is generally formed for one variable resistor. However, a plurality of through-holes may be formed for one variable resistor. One through-hole may be formed for a plurality of variable resistors. The method of forming the through-hole is not especially limited, and the through-hole may be formed when the board is formed.

The light source device in accordance with preferred embodiments of the present invention is not especially limited and it may or may not include other components as long as it includes the plurality of point light sources, the variable resistor, and the board as components. It is preferable that the light source device includes a connector for connecting the point light source to a circuit for driving the point light source. The connector may be arranged on the external surface of the board, but it is generally arranged on the internal surface of the board.

According to another preferred embodiment of the present invention, a light source device includes: a board; a plurality of point light sources arranged on a surface of the board and connected in series; and a variable resistor, wherein the variable resistor is disposed on a surface opposite to the surface on which the plurality of point light sources are arranged; and at least one point light source arranged on an end side among the plurality of point light sources is connected in parallel to the variable resistor. According to this unique structure, the variable resistor is arranged on the side opposite to the side where the point light sources are mounted. Therefore, the resistance value of the variable resistor can be adjusted from the outside without disassembling the backlight unit even after the unit is assembled. Therefore, the uniformity of the luminance and the color on the display surface can be improved. In this case, it is preferable that the variable resistor has an adjusting portion arranged to adjust the resistance on a side other than the board side (for example, the side opposite to the board).

It is preferable that the plurality of point light sources are light-emitting diodes. According to this configuration, a reduction in costs, direct drive by a direct-current power, noise free operation, and the like, can be realized. The colors of the light emitted from the light-emitting diodes are not especially limited. Examples of the colors include chromatic colors such as red (R), green (G), blue (B), yellow (Y), cyan (C), magenta (M), and orange, and white (W). The light-emitting diodes of chromatic colors may be white light-emitting diodes having a surface on which a chromatic film is formed to convert light of white into light of another chromatic color.

It is preferable that the light-emitting diodes include a red light-emitting diode, a green light-emitting diode, and a blue light-emitting diode. As a result, the color reproduction range of the display device can be more effectively expanded. White light is produced using the light-emitting diodes of three primary colors of RGB, and thereby a luminous efficiency higher than that of a white light-emitting diode can be obtained. The green light-emitting diode has a luminance smaller than luminances of a red light-emitting diode and a blue light-emitting diode. Therefore, it is preferable that the number of the green light-emitting diode is larger than the numbers of the red light-emitting diode and the blue light-emitting diode. It is more preferable that the number of the green light-emitting diode is substantially two times larger than that of the red light-emitting diode and/or the blue light-emitting diode. Examples of the color array pattern of the light-emitting diodes in this configuration include GBGR and GRGB. It is more preferable that the light-emitting diodes include another chromatic light-emitting diode such as a yellow light-emitting diode, in order to more effectively expand the color reproduction range.

It is preferable that an amount of an electric current flowing into a variable resistor connected in parallel to a light-emitting diode at an end is adjusted to about 50% or more and about 90% or less relative to an amount of an electric current flowing into the light emitting diode at the end. As a result, the luminance of the light-emitting diode at the end can be properly reduced, and therefore, the uniformity of the luminance and the color on the display surface can be more improved. It is more preferable that the amount of the electric current flowing into the variable resistor connected in parallel to the light-emitting diode at the end is adjusted to about 75% relative to the amount of the electric current flowing into the light emitting diode at the end.

It is preferable that an amount of an electric current flowing into a variable resistor connected in parallel to a second light-emitting diode from the end is adjusted to about 20% or more and about 50% or less relative to an amount of an electric current flowing into the second light-emitting diode from the end. According to such a configuration, the luminance of the second light-emitting diode from the end can be properly reduced. Therefore, the uniformity of the luminance and the color on the display surface can be further improved. It is more preferable in the light source device that the amount of the electric current flowing into the variable resistor connected in parallel to the second light-emitting diode from the end is adjusted to about 25% relative to the amount of the electric current flowing into the second light-emitting diode from the end.

It is preferable in the point light sources that a green light-emitting diode is arranged at the end, and a blue light-emitting diode is arranged at the second from the end. According to this configuration, the yellowish color at the corners of the display surface is improved and thereby the color uniformity on the display surface can be particularly improved.

Other preferred embodiments of the present invention include: (1) a backlight unit including the light source device, wherein the plurality of point light sources are arranged on a side of a display surface toward a display surface side, and (2) a backlight unit including the light source device, wherein the plurality of point light sources are arranged just below a display surface toward the display surface. According to the side backlight unit (1), the thickness of the display device can be reduced and simultaneously a high luminance uniformity can be obtained. According to the direct backlight unit (2), the light use efficiency can be increased and therefore a high luminance can be obtained. According to the configuration (1), the "point light sources are arranged toward a display surface side" means that the point light sources are arranged on the internal surface of the board.

Examples of the configuration (1) include a configuration in which a reflective plate and a light guide plate are stacked in this order on the internal bottom surface of a chassis, and the light source device is arranged between at least one internal side surface of the chassis and the side surface of the light guide plate. According to this configuration, a through-hole is formed in the side surface of the chassis. At least a portion of this through-hole overlaps with the through-hole of the board of the light source device, and thereby, the resistance value of the variable resistor can be adjusted from the outside of the chassis even after assembling the backlight unit. The light guide plate is arranged on the reflective plate and the side surface of the light guide plate (except the side surface adjacent to the light source device) is generally covered with a reflective film and the like. Therefore, light incident into the side surface of the light guide plate from the point light sources can be emitted to the display surface with efficiency.

According to the configuration (1), the light source device is arranged on at least one side of the display surface, and may be arranged on a plurality of sides of the display surface. In view of uniformity of the luminance distribution in the display surface, it is preferable that the light source device is arranged on two sides opposite to each other of the display surface. For example, it is preferable that the light source device is arranged on the upper and lower sides of the display surface if a plurality of point light sources (LEDs and the like) are mounted. The light source device is generally fixed to the side surface of the chassis. The way of fixing it is not especially limited. Adhesion, cohesion, fixing using a holder, fixing using a screw and the like may preferably be used. It is preferable that a diffuser is stacked on the light guide plate in order to diffuse light emitted from the light guide plate to improve the luminance uniformity. It is preferable that various optical sheets such as a lens film (prism sheet) are appropriately stacked on the light guide plate (or the diffuser) in order to improve the luminance per unit area of the display surface. The configuration (1) may be a configuration in which the board of the light source device serves as the side surface of the chassis of the backlight unit.

Examples of the configuration (2) include a configuration in which a plurality of the light source devices are arranged on the internal bottom surface of the chassis and the diffuser is stacked on the plurality of light source devices. According to this configuration, a through-hole is formed in the bottom surface of the chassis and at least a portion of this through-hole overlaps with the through-hole of the board of the light source device. As a result, the resistance value of the variable resistor can be adjusted from the outside of the chassis even after assembling the backlight unit. The internal surface of the chassis is generally covered with the reflective plate. Therefore, light from the point light sources is emitted to the display surface with efficiency, and simultaneously, the emitted light can be diffused into a planar shape by the diffuser.

According to the configuration (2), the light source devices may be arranged in such a way that the array direction of the plurality of point light sources is substantially parallel to the horizontal direction of the display surface. However, it is preferable that the light source devices are arranged in such a way that the array direction of the plurality of point light sources is substantially parallel to the vertical direction of the display surface. The light source devices are generally fixed to the bottom surface of the chassis, and the way of fixing it is not especially limited. Adhesion, cohesion, fixing using a holder, fixing using a screw and the like may preferably be used. It is preferable that various optical sheets such as a lens film (prism sheet) are appropriately stacked on the plurality of light source devices in order to improve the luminance per unit area of the display surface. The configuration (2) may be a configuration in which the boards of the light source devices serve as the bottom surface of the chassis of the backlight unit.

The backlight unit generally includes a circuit board in which a driving circuit for the point light sources is arranged on another board. The driving circuit is connected to the point light sources through wirings and the like, and it may be arranged on the internal surface of the another board, but preferably arranged on the external surface of the another board. It is preferable that the circuit board includes connectors for connecting the point light sources to the driving circuit. The connectors may be arranged on the internal surface of the another substrate, but they are preferably arranged on the external surface of the another substrate. The circuit board is generally arranged on the external bottom surface (back surface) of the chassis of the backlight unit. In this case, the circuit board is fixed to the back surface of the chassis, and the way of fixing it is not especially limited.

According to another preferred embodiment of the present invention, a liquid crystal display device includes the backlight unit described above. Such a liquid crystal display device can display high-quality images having high color uniformity on the display surface. Preferable configurations of the liquid crystal display device of the present invention include a configuration in which the liquid crystal display device include a liquid crystal display panel unit on the display surface side of the backlight unit. According to this configuration, using the backlight unit of various preferred embodiments of the present invention, light with high uniformity of the luminance and the color can be emitted from the back surface of the liquid crystal display panel to the liquid crystal display panel inside the liquid crystal display panel unit. As a result, display with high qualities can be realized.

The liquid crystal display device may be a transmissive liquid crystal display device or a transflective (semi-transmissive) liquid crystal display device. The display mode of the liquid crystal display device is not especially limited. Examples thereof include VA (vertical alignment) mode, TN (twisted nematic) mode, IPS (in-plane switching) mode, and OCB (optically compensated birefringence) mode.

According to the light source device of various preferred embodiments of the present invention, the resistance value of the variable resistor connected in parallel to the point light source can be adjusted without disassembling the backlight unit even after the unit is assembled. Therefore, the uniformity of the luminance and the color on the display surface can be improved.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 3A is a planar view schematically showing a configuration of a front surface of the side LED backlight unit in the first preferred embodiment of the present invention.

FIG. 3B is a cross-sectional view schematically showing the side LED backlight unit taken along line C-D in FIG. 3A.

FIG. 3C is a perspective view schematically showing a configuration of a back surface of the side LED backlight unit.

FIG. 3D is a planar view schematically showing a configuration of the LED power board in FIG. 3C.

FIG. 7A is a planar view schematically showing a configuration of the direct LED backlight unit according to the second preferred embodiment of the present invention.

FIG. 7B is a cross-sectional view showing the direct LED backlight unit taken along line G-H in FIG. 7A.

FIG. 7C is an enlarged view of the region shown by the dotted line in FIG. 7B.

FIG. 7D is a planar view schematically showing a configuration of the back surface of the direct LED backlight unit according to the second preferred embodiment of the present invention.

DETAILED DESCRIPTION OF THE PREFERRED EMBODIMENTS

The present invention is described in more detail below with reference to preferred embodiments thereof, but the present invention is not limited to only these preferred embodiments.

First Preferred Embodiment

Steps of assembling a liquid crystal display device in accordance with the first preferred embodiment of the present invention are mentioned below.

Production of LED Backlight Module (Light Source Device)

Figure 1A:
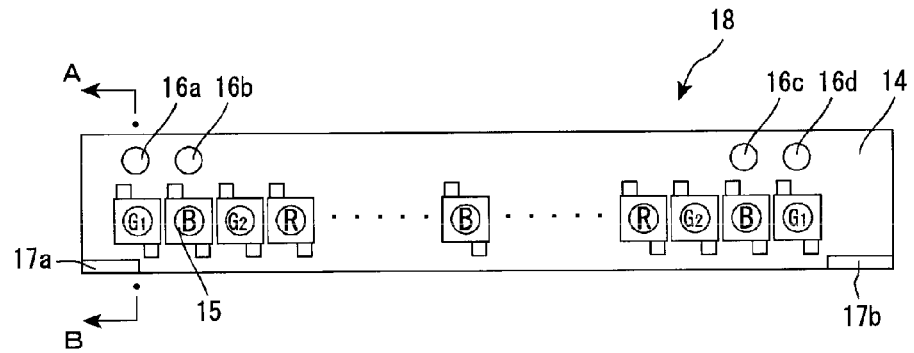
FIG. 1A is a planar view schematically showing a configuration of the LED backlight module according to a first preferred embodiment of the present invention.
Figure 1B:
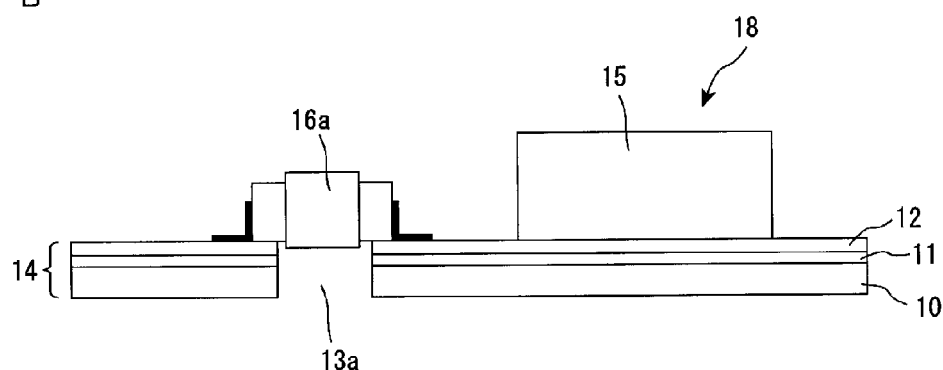
FIG. 1B is a cross sectional view schematically showing the LED backlight module taken along line A-B in FIG. 1A.

FIG. 1A is a planar view schematically showing a configuration of an LED backlight module in accordance with the first preferred embodiment. FIG. 1B is a cross sectional view schematically showing the LED backlight module taken along line A-B in FIG. 1A.

On an aluminum board 10, a transparent insulating layer 11 with a thickness of about 80 μm, for example, was formed. Thereon, a copper foil layer 12 with a thickness of about 70 μm, for example, was formed by printing. Then, the outline of the stacked body was shaped by a punching process and simultaneously, a through-hole 13a was formed at a position where a variable resistor was to be mounted. As a result, a flexible printing circuit (FPC) 14 was completed.

Then, light-emitting diodes (LEDs) 15, variable resistors 16a to 16d, connectors 17a and 17b were mounted on the FPC 14 by reflow soldering. The LEDs 15 included LEDs of three primary colors of a red LED (R-LED), a green LED (G-LED), and a blue LED (B-LED), and twelve R-LEDs, twenty-six G-LEDs, and thirteen B-LEDs were used. As shown in FIG. 1A, such LEDs were arrayed at regular intervals based on a color array pattern of green ($G_1$), blue (B), green ($G_2$), and red (R). The variable resistors 16a to 16d were arranged on the through-holes 13a to 13d of the FPC 14, respectively, as shown in FIG. 1B. Adjustment portions of the variable resistors 16a to 16d were exposed to the outside through the through-holes 13a to 13d, respectively.

Figure 2:
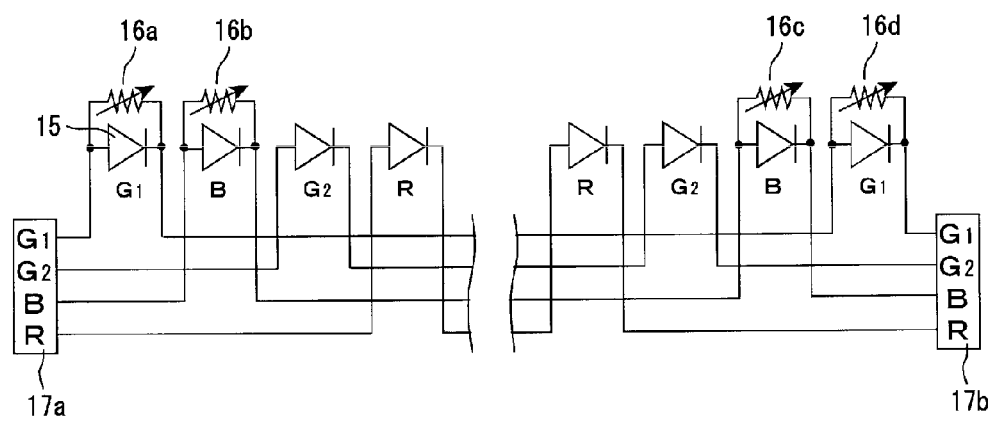
FIG. 2 is a view schematically showing the circuit for the LED backlight module according to the first preferred embodiment of the present invention.

FIG. 2 is a view schematically showing a circuit for a LED backlight module 18 in the first preferred embodiment. As shown in FIG. 2, a $G_1$-LED, a B-LED, a $G_2$-LED, and an R-LED of the LEDs 15 were individually connected in series to be individually driven. The variable resistors 16a and 16d were connected in parallel to the $G_1$-LEDs at right and left ends, respectively. The variable resistors 16b and 16d were connected in parallel to the B-LEDs that were the second from each end, respectively. According to a side LED backlight unit, light emitted from the LEDs 15 at the ends is reflected by the internal side surface of the back frame and emitted from an emission surface of the light guide plate. Therefore, light emitted from the corners of the display surface has a relatively larger intensity than that of light emitted from other regions. Accordingly, the variable resistors 16a to 16d were connected in parallel to the LEDs 15 at the ends, and the resistance values were previously set to specific values so that the luminance and the color could become uniform between the corner regions and other regions of the display surface. As a result, an LED backlight module 18 was completed.

Assembling of Side LED Backlight Unit

FIG. 3A is a planar view schematically showing a configuration of a front surface of a side LED backlight unit in accordance with the first preferred embodiment. FIG. 3B is a cross-sectional view schematically showing the side LED backlight unit taken along line C-D in FIG. 3A. FIG. 3C is a perspective view schematically showing a configuration of a back surface of the side LED backlight unit in accordance with the first preferred embodiment. FIG. 3D is a planar view schematically showing a configuration of an LED power board 30 in FIG. 3C.

As shown in FIG. 3A, the LED backlight module 18 was mounted on the upper and lower side surfaces of a back frame 20. In this case, as shown in FIG. 3B, the through-hole 13a of the FPC 14 overlapped with a through-hole 20a that was formed in the side surface of the back frame 20. Similarly, other through-holes of the FPC 14 overlapped with through-holes that were formed in the side surface of the back frame 20, respectively. Then, as shown in FIG. 3B, a reflective sheet 21 and a light guide plate 22 were stacked on the bottom surface of the back frame 20. Then, the reflective sheet 21 and the light guide plate 22 were fixed by being covered with a front frame 23.

As shown in FIG. 3D, wirings 40 and the LED power board 30 were mounted on the back surface of the back frame 20. In the LED power board 30, a LED power circuit 31 that was a circuit for driving the LEDs 15 and connectors 32a and 32b were arranged on a board 33, as shown in FIG. 3D. The LED power circuit 31 inside the LED power board 30 was connected to the LED backlight module 18 through the wirings 40 and the connectors 32a and 32b, respectively, as shown in FIG. 3C. As a result, an LED backlight unit 100 was completed.

Examination of Uneven Color of Side LED Backlight Unit

The LED backlight unit 100 assembled in the above-mentioned process was examined for uneven color. At four corners (the regions shown by the dotted line in FIG. 3A) of the light guide plate 22, a yellowish color was observed. This is attributed to variation of characteristics of the LEDs 15. This is not found until the unit is assembled and then LEDs 65 that are connected to the LED power circuit 31 are driven. In the present preferred embodiment, the variable resistors 16a to 16d that were connected in parallel to the $G_1$-LEDs and B-LEDs at the end sides were exposed to the outside through the through-holes 13a to 13d and 20a to 20d, as shown in FIG. 3B. Accordingly, resistance values of the variable resistors 16a to 16d could be adjusted from the outside without disassembling the LED backlight unit 100. As a result, the color uniformity could be improved.

Assembling of Liquid Crystal Display Device

On the front frame 23 of the LED backlight unit 100, a diffuser (not shown) and an optical sheet (not shown) were stacked. Then, using a module assembly device, the backlight unit 100 and a liquid crystal display panel unit (not shown) were positioned at specific positions, respectively, and superimposed upon each other to be assembled. After specific connection procedures and the like, a liquid crystal display device was completed.

According to the liquid crystal display device assembled in the present preferred embodiment, even after the LED backlight unit 100 was assembled, the resistance values of the variable resistors 16a to 16d that were connected to the LEDs 15 at the end sides could be adjusted without disassembling the unit 100. Therefore, high display qualities could be obtained. In addition, the LEDs 15 were adopted as a light source, and therefore, a reduction in costs, direct drive by a direct-current power, noise free operation, and the like, could be realized. Further, bright colors with high saturation could be displayed because the LEDs of RGB three colors were used.

Second Preferred Embodiment

Steps of assembling a liquid crystal display device in accordance with the present preferred embodiment are described below. A direct LED backlight unit was used as the LED backlight unit in the present preferred embodiment.

Production of LED Backlight Module (Light Source Device)

Figure 4A:
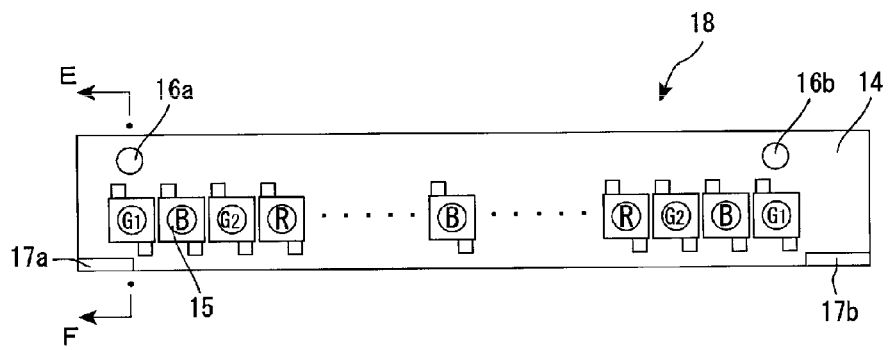
FIG. 4A is a planar view schematically showing a configuration of the LED backlight module in accordance with a second preferred embodiment of the present invention.
Figure 4B:
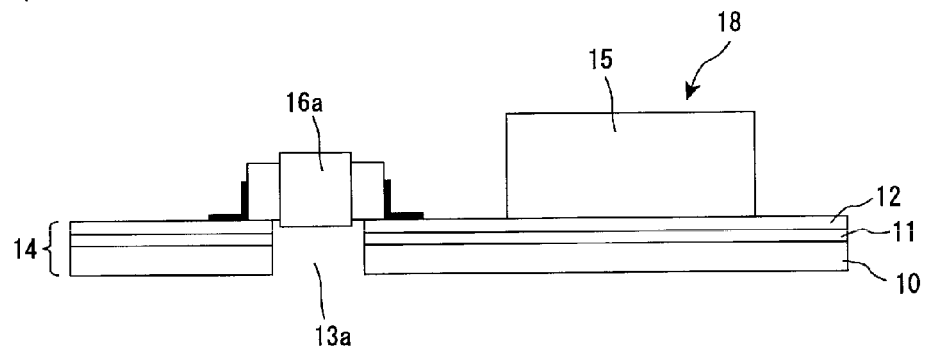
FIG. 4B is a cross-sectional view schematically showing the LED backlight module taken along line E-F in FIG. 4A.
Figure 5:
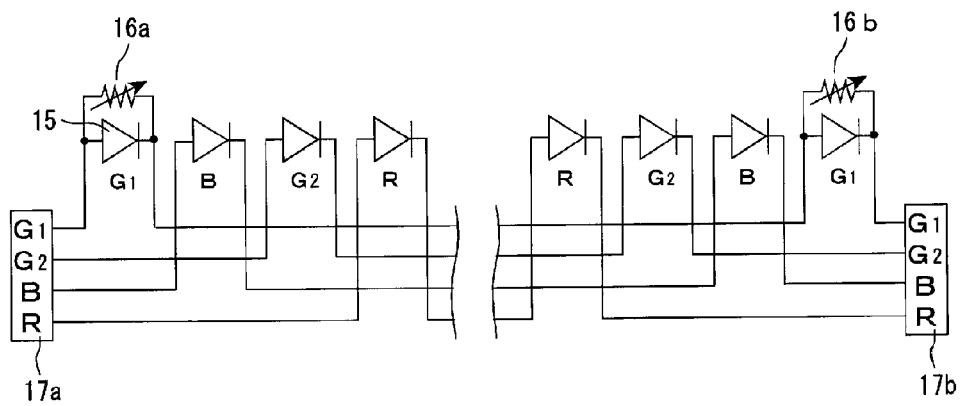
FIG. 5 is a view schematically showing a circuit of the LED backlight module according to the second preferred embodiment of the present invention.

FIG. 4A is a planar view schematically showing a configuration of an LED backlight module in the second preferred embodiment. FIG. 4B is a cross-sectional view schematically showing the LED backlight module taken along line E-F in FIG. 4A. FIG. 5 is a view schematically showing a circuit for the LED backlight module in the second preferred embodiment.

The LED backlight module in the present preferred embodiment was produced in the same manner as in the first preferred embodiment, except that only $G_1$-LEDs at the right and left ends were connected in parallel to the variable resistors 16a and 16b, respectively, as shown in FIGS. 4A, 4B, and 5.

The variable resistors 16a and 16b were disposed on the through-holes 13a of the FPC 14, respectively. The adjustment portions of the variable resistors 16a and 16b were exposed to the outside through the through-holes 13a, respectively. The resistance values of the variable resistors 16a and 16b were previously set to specific values, respectively, so that the uneven luminance and color between the side region and other regions of the display surface due to the arrangement of the LEDs 15 that were light sources could be prevented. In the present preferred embodiment, preferably eight, for example, LED backlight modules 18 were prepared and used as LED backlight modules 18a to 18h.

Production of LED Power Board (Circuit Board)

Figure 6:
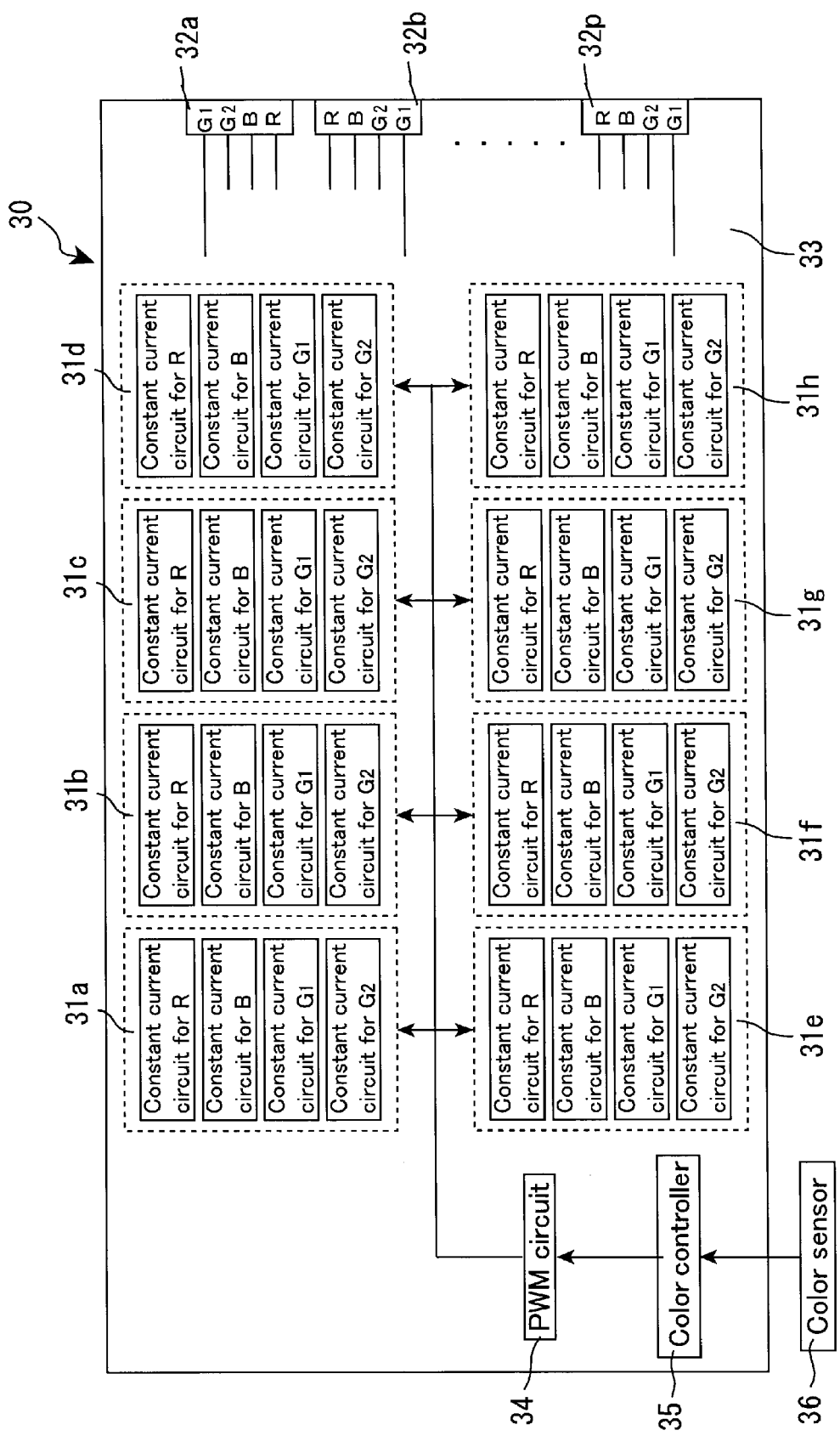
FIG. 6 is a planar view schematically showing a configuration for the LED power board according to the second preferred embodiment of the present invention.
Figure 8A:
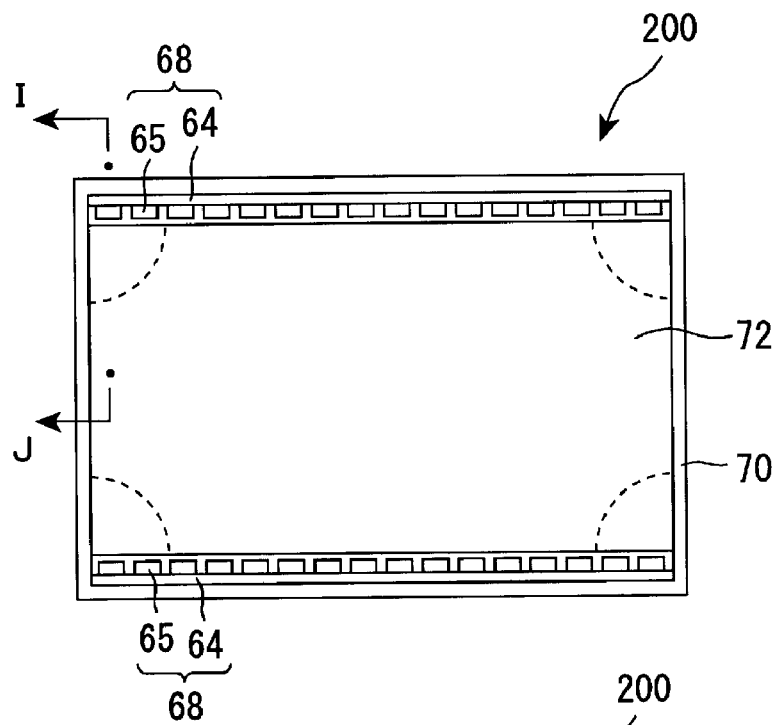
FIG. 8A is a planar view schematically showing a configuration of a conventional side LED backlight unit.
Figure 8B:
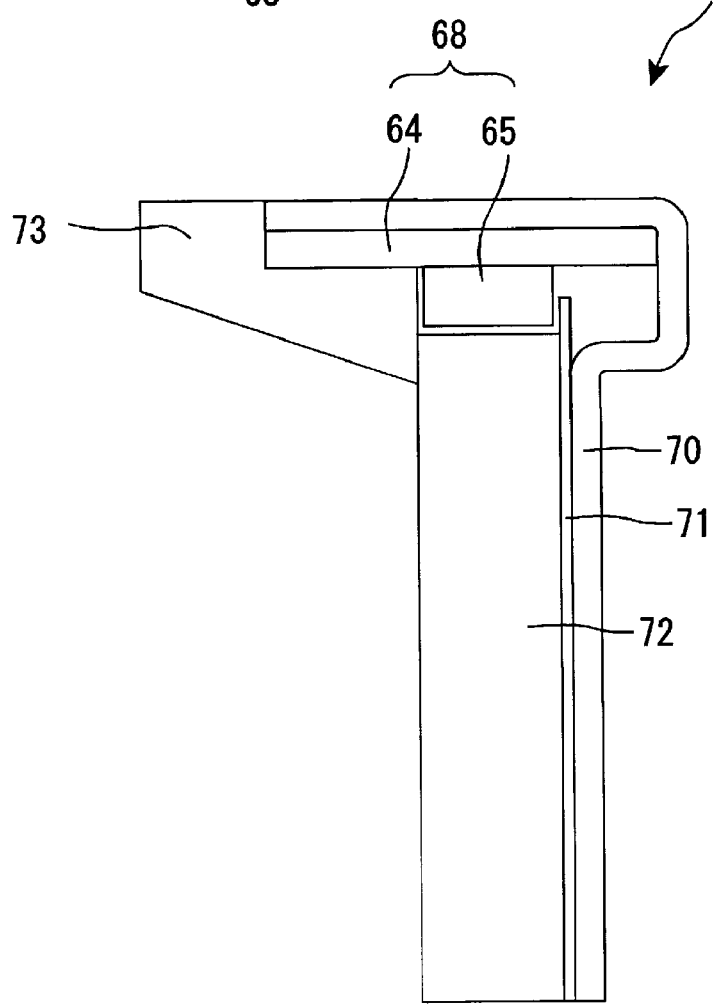
FIG. 8B is a cross-sectional view schematically showing the conventional side LED backlight unit taken along line I-J in FIG. 8A.

FIG. 6 is a planar view schematically showing a configuration of an LED power board in the second preferred embodiment.

As shown in FIG. 6, LED power circuits 31a to 31h that were connected to the LED backlight modules 18a to 18h, respectively, a pulse width modulation (PWM) circuit 34, a color controller 35 that controlled information from a color sensor 36, were disposed on aboard 33. Successively, preferably sixteen, for example, connectors 32a to 32p were mounted. As a result, an LED power board 30 was completed.

Assembling of Direct LED Backlight Unit

FIG. 7A is a planar view schematically showing a configuration of a front surface of a direct LED backlight unit in accordance with the second preferred embodiment. FIG. 7B is a cross-sectional view showing the direct LED backlight unit taken along line G-H in FIG. 7A. FIG. 7C is an enlarged view of the region surrounded by the dotted line in FIG. 7B. FIG. 7D is a planar view schematically showing a configuration of a back surface of the direct LED backlight unit in the second preferred embodiment.

As shown in FIGS. 7A and 7B, the LED backlight modules 18a to 18h were mounted on the internal bottom surface of the back frame 20. In this case, as shown in FIG. 7C, the through-hole 13a of the FPC 14 was arranged to overlap with the through-hole 20a formed in the bottom surface of the back frame 20. Then, a diffuser 24 and an optical sheet 25 were stacked and fixed.

As shown in FIG. 7D, an LED power board 30 was mounted on the back surface of the back frame 20. Then, the LED backlight modules 18a to 18h were connected to the LED power circuits 31a to 31h through wirings (not shown) and the like, respectively. As a result, an LED backlight unit 100 was completed.

Examination of Uneven Color of Direct LED Backlight Unit

The LED backlight unit 100 assembled in the above-mentioned process was examined for uneven color. A yellowish color was observed at the side region. This is attributed to variation of characteristics of the LEDs 15. This is not found until the unit is assembled and the LEDs 65 that are connected to the LED power circuits 31 are driven. In the present preferred embodiment, the variable resistors 16a and 16b connected in parallel to the $G_1$-LEDs on the end sides were exposed to the outside through the through-holes 13a and 13b and the through-holes 20a and 20b of the back frame 20, as shown in FIG. 7C. Accordingly, the resistances of the variable resistors 16a and 16b were adjusted from the outside without disassembling the LED backlight unit 100. As a result, the color uniformity could be improved.

Assembling of Liquid Crystal Display Device

Using a module assembly device, the backlight unit 100 and a liquid crystal display panel unit (not shown) were positioned at specific positions, respectively, and superimposed upon each other to be assembled. After specific connection procedures and the like, a liquid crystal display device was completed. The liquid crystal display device assembled in the present preferred embodiment also could exhibit the operation and effects as in the first preferred embodiment of the present invention.

The terms "or more" and "or less" include the described values, respectively.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A light source device comprising:
a board;
a plurality of point light sources arranged on a surface of the board and connected in series; and
a variable resistor; wherein
the variable resistor is disposed on the surface on which the plurality of point light sources are arranged on the board;

at least one of the point light sources arranged on an end side among the plurality of point light sources is connected in parallel to the variable resistor; and the board has a through-hole in an area where the variable resistor is located.

2. The light source device according to claim 1, wherein the plurality of point light sources are light-emitting diodes.

3. The light source device according to claim 2, wherein the light-emitting diodes include a red light-emitting diode, a green light-emitting diode, and a blue light-emitting diode.

4. The light source device according to claim 2, wherein an amount of an electric current flowing into a variable resistor connected in parallel to one of the light-emitting diodes at an end is adjusted to about 50% or more and about 90% or less relative to an amount of an electric current flowing into the light emitting diode at the end.

5. The light source device according to claim 4, wherein an amount of an electric current flowing into a variable resistor connected in parallel to a second light-emitting diode from the end is adjusted to about 20% or more and about 50% or less relative to an amount of an electric current flowing into the second light-emitting diode from the end.

6. The light source device according to claim 5, wherein a green light-emitting diode is arranged at the end, and a blue light-emitting diode is arranged at the second from the end.

7. A backlight unit comprising the light source device of claim 1, wherein the plurality of point light sources are arranged on a side of a display surface facing toward a display surface side.

8. A backlight unit comprising the light source device of claim 1, wherein the plurality of point light sources are arranged just below a display surface facing toward the display surface.

9. A liquid crystal display device comprising the backlight unit of claim 7.

10. A liquid crystal display device comprising the backlight unit of claim 8.

11. A light source device comprising:
a board;
a plurality of point light sources arranged on a surface of the board and connected in series; and
a variable resistor; wherein
the variable resistor is disposed on a surface opposite to the surface on which the plurality of point light sources are arranged; and
at least one of the point light sources arranged on an end side among the plurality of point light sources is connected in parallel to the variable resistor.

12. The light source device according to claim 11, wherein the plurality of point light sources are light-emitting diodes.

13. The light source device according to claim 12, wherein the light-emitting diodes include a red light-emitting diode, a green light-emitting diode, and a blue light-emitting diode.

14. The light source device according to claim 12, wherein an amount of an electric current flowing into a variable resistor connected in parallel to a light-emitting diode at an end is adjusted to about 50% or more and about 90% or less relative to an amount of an electric current flowing into the light-emitting diode at the end.

15. The light source device according to claim 14, wherein an amount of an electric current flowing into a variable resistor connected in parallel to a second light-emitting diode from the end is adjusted to about 20% or more and about 50% or less relative to an amount of an electric current flowing into the second light-emitting diode from the end.

16. The light source device according to claim 15, wherein a green light-emitting diode is arranged at the end, and a blue light-emitting diode is arranged at the second from the end.

17. A backlight unit comprising the light source device of claim 11, wherein the plurality of point light sources are arranged on a side of a display surface and are facing toward a display surface side.

18. A backlight unit comprising the light source device of claim 11, wherein the plurality of point light sources are arranged just below a display surface and are facing toward the display surface.

19. A liquid crystal display device comprising the backlight unit of claim 17.

20. A liquid crystal display device comprising the backlight unit of claim 18.

* * * * *